(12) United States Patent
Maes et al.

(10) Patent No.: US 12,736,428 B2
(45) Date of Patent: Sep. 15, 2026

(54) PROTECTION OF SENSING ELEMENT DURING MOULDING

(71) Applicant: Melexis Technologies NV, Tessenderlo (BE)

(72) Inventors: Ben Maes, Tessenderlo (BE); Jian Chen, Tessenderlo (BE); Jeroen Didden, Tessenderlo (BE); Appo Van Der Wiel, Tessenderlo (BE); Cathleen Rooman, Tessenderlo (BE)

(73) Assignee: Melexis Technologies NV, Tessenderlo (BE)

( * ) Notice: Subject to any disclaimer, the term of this patent is extended or adjusted under 35 U.S.C. 154(b) by 273 days.

(21) Appl. No.: 18/541,593

(22) Filed: Dec. 15, 2023

(65) Prior Publication Data

US 2024/0210262 A1 Jun. 27, 2024

(30) Foreign Application Priority Data

Dec. 23, 2022 (EP) .................................... 22216332

(51) Int. Cl.
*G01L 19/06* (2006.01)
*B81C 1/00* (2006.01)
(Continued)

(52) U.S. Cl.
CPC ...... *G01L 19/0618* (2013.01); *G01L 19/0069* (2013.01); *H05K 13/04* (2013.01);
(Continued)

(58) Field of Classification Search
CPC .. H10N 30/302; H10N 30/063; H10N 30/875; G01L 19/0069; G01L 19/0618;
(Continued)

(56) References Cited

U.S. PATENT DOCUMENTS 7,900,521 B2 3/2011 Hooper et al.
11,543,466 B2 * 1/2023 Chen .................. G01R 33/0047
(Continued)

FOREIGN PATENT DOCUMENTS

CN 102372248 A 3/2012
DE 102009034638 A1 * 2/2010 ........... G01F 1/6842
(Continued)

OTHER PUBLICATIONS

Extended European Search Report from corresponding EP Application No. 22216332.1, Jun. 9, 2023.
(Continued)

*Primary Examiner* — Peter J Macchiarolo
*Assistant Examiner* — Monica S Young
(74) *Attorney, Agent, or Firm* — Workman Nydegger

(57) ABSTRACT

A sensor package comprises an active element with a first region and an opposite second region. The first region includes a sensing structure. The second region comprises at least one contact pad. A moulding compound encapsulates the second region and not the first region. The active element comprises at least one conductive line for routing signals from the sensing structure to the contact pad. The projection of the conductive line over the active element corresponds to a portion of the external surface of the active element. The active element comprises at least one dummy track providing a protrusion thereby raising a portion of the surface of the active element to at least the same height as the portion corresponding to the conductive line. These protrusions can receive mechanical pressure from a moulding insert applied during manufacture, relieving pressure over the portion of the surface including the conductive lines.

15 Claims, 5 Drawing Sheets

(51) Int. Cl.

| | |
|---|---|
| ***G01L 19/00*** | (2006.01) |
| ***H05K 13/04*** | (2006.01) |
| ***H10N 30/063*** | (2023.01) |
| ***H10N 30/30*** | (2023.01) |
| ***H10N 30/87*** | (2023.01) |

(52) U.S. Cl.
CPC ......... *H10N 30/063* (2023.02); *H10N 30/302* (2023.02); *H10N 30/875* (2023.02); *B81B 2201/0264* (2013.01); *B81B 2207/012* (2013.01); *B81C 1/00825* (2013.01)

(58) Field of Classification Search
CPC ...... B81B 2201/0264; B81B 2207/012; H05K 13/04; H01L 23/3107; B81C 1/00825
USPC ............................................................ 73/756
See application file for complete search history.

(56) References Cited

U.S. PATENT DOCUMENTS

2007/0007607 A1 1/2007 Sakai et al.
2015/0330820 A1* 11/2015 Sakuma .................. G01F 1/684 257/417
2017/0363492 A1* 12/2017 Chen ..................... G01L 9/0042
2019/0346327 A1* 11/2019 van Dommelen ...... H01L 23/16
2020/0072692 A1* 3/2020 Otte ...................... G01L 9/0048
2020/0075466 A1* 3/2020 Chen ....................... H01L 23/13
2020/0182661 A1* 6/2020 Hunziker ........... G01N 33/0036
2021/0018574 A1* 1/2021 Chen .................. G01R 33/0052
2022/0057211 A1 2/2022 Nakashima et al.

FOREIGN PATENT DOCUMENTS

JP 2000065662 A 3/2000
JP 4978587 B2 * 7/2017 ........... G01F 1/6842
JP 2018186207 A * 11/2018 ....... H01L 23/49562
WO WO-2018197484 A1 * 11/2018 ........... G01D 11/245

OTHER PUBLICATIONS

Chinese Office Action from Corresponding Chinese Patent Application No. CN202311816784.0, Apr. 28, 2026.

* cited by examiner

PROTECTION OF SENSING ELEMENT DURING MOULDING

FIELD OF THE INVENTION

The invention relates to the field of packaged electronic devices. More specifically it relates to sensor packages and processes for packaging dies, in particular micro-electromechanical system dies.

BACKGROUND OF THE INVENTION

Sensors are important devices for monitoring diverse processes and materials in systems with different degrees of complexity. An example are sensors for automobile applications, which usually require high reliability. Packaged sensors, including integrated sensors, usually include a probing part which receives stimulation from the environment or material to be tested, and delicate electronics for processing the signal generated as a response to the stimulation.

In the field of sensor devices, the electronics are usually encased, in many cases by moulding compound such as epoxy-based mould compounds (EMC). For example, overmoulding can be employed to encapsulate an integrated circuit and any bond wires, leaving a cavity for attachment to a sensor element, wherein the cavity may include exposed bond pads to connect to the sensor element. Afterwards, wire bonding and die attach need to be performed, before moulding. These processes are slow and prone to errors, and usually require additional protection for the sensor connections in the cavity.

Some methods include providing a sensing element on a substrate with electronics, and packaging partially the substrate. This way, the sensing elements are not encased, so they can properly receive the stimulation. However, this process of encasing requires holders and moulds which can damage the substrate or parts thereof, and the device must be discarded, with the resulting economic losses due to lost devices and production costs and time. It would be desirable to provide a safe and reliable method of manufacturing these sensors, with high production yield.

SUMMARY OF THE INVENTION

It is an object of embodiments of the present invention to provide a sensor package and a method of manufacture thereof, wherein bond pads are placed under mould and a part of the sensor is mould-free, with high production yield and reliable connections.

The present invention provides a sensor package comprising an active element comprising a first region and a second region opposite to the first region. The first region includes a sensing structure, and the second region comprises at least one contact pad. A moulding compound encapsulates the second region. The first region of the active element is free from moulding compound. Further, the active element comprises at least one conductive line for routing signals from the sensing structure of the first region to the at least one contact pad of the second region.

The active element comprises an external surface wherein the projection of the at least one conductive line over the active element corresponds to a portion of said external surface. The active element further comprises at least one dummy track providing a protrusion thereby raising a portion of the surface of the active element to at least the same height as the portion corresponding to the conductive line.

These protrusions can receive mechanical pressure from a moulding insert applied during manufacture, thus relieving pressure over the portion of the surface including the conductive lines. The dummy track extends along at least the first region.

It is an advantage of embodiments of the present invention that a reliable device is obtained wherein signals generated in the first region are transmitted through undamaged conductive line.

In some embodiments, the portion of the surface corresponding to the conductive tracks form a protrusion, and the protrusion formed by the dummy track has the same height or is taller, so as to receive at least part of the pressure from the contact with the insert.

In some embodiments of the present invention, a processing unit is present in the sensor package, covered by the moulding compound, and electrically connected to the conductive lines of the active element. It is an advantage of embodiments of the present invention that an integrated packaged device can be provided.

In some embodiments of the present invention, the sensor package further comprises a further platform onto which the processing unit is attached. It is an advantage of embodiments of the present invention that the processing unit can be completely insulated by moulding compound.

In some embodiments of the present invention, the dummy track is substantially on the first region extending on a portion of the second region. The insert upon being applied on the active element, can contact the protruding surfaces provided by the dummy track.

It is an advantage of embodiments of the present invention that the insert will substantially contact the dummy track in the first region to be protected with a high tolerance of alignment of the insert during manufacture.

In some embodiments of the present invention, the conductive line is covered by a protective layer. The dummy track may also be covered by a protective layer, e.g. the same protective layer, thereby forming layer stacks.

It is an advantage of embodiments of the present invention that further reduction of risk of damage can be provided, and further during use of the device, at least the conductive layer and any other sensing structure can be protected from degradation due to e.g. corrosion.

In some embodiments of the present invention, the dummy track comprises at least one strip parallel to the direction of the conductive line.

It is an advantage of embodiments of the present invention that the conductive line is trenched between to supporting stripes.

In some embodiments of the present invention, the sensor package further comprises at least one strip arranged to block moulding compound from entering in the hollow region between the insert and the protrusion, e.g. between the insert and the lower portions at the sides of the protrusions. For example, the strip may extend perpendicularly to the conductive lines and/or the elongated dummy tracks.

It is an advantage of embodiments of the present invention that ingress of moulding compound between the insert and active element, in particular its dummy track, is reduced or avoided completely.

In some embodiments of the present invention, the sensor package is a pressure sensor package.

It is an advantage of embodiments of the present invention that the manufacture process provides a high yield of reliable pressure sensor packages.

In some embodiments of the present invention, the sensing structure comprises a membrane and a plurality of piezo-resistors.

It is an advantage of embodiments of the present invention that the processing unit can be completely insulated by moulding compound, as well as the bondpads on the active element (e.g. the sensing die) and bondwires.

In some embodiments of the present invention, the first region of the active element protrudes from the moulding compound thereby being in a cantilever position.

It is an advantage of embodiments of the present invention that the first region can act as a probe. It is an additional advantage that a sensor package may be a relative pressure sensor package.

In a second aspect, the present invention includes a method of providing a sensor package. The method comprises:

providing an active element with a first region comprising a sensing structure, and a second region being opposite to the first region, the second region comprising at least one contact pad, and at least one conductive line wherein the projection of the conductive line on the active element corresponds to a portion of an external surface of the active element, for routing signals from the sensing element to the at least one contact pad, providing an insert covering the first region, forming a package by providing a moulding compound for covering the second region including a portion of the at least one conductive line, wherein the insert impedes moulding compound from reaching at least the first region, so that the active element extends between an open volume and a packaged volume encapsulated by moulding compound.

The method further comprising providing at least one dummy track extending along at least the first region of the active element, wherein the at least one dummy track rises the surface of the active element at least to the same height as the portion of the external surface corresponding to the conductive line, for protecting the active element from damages by reducing pressure of the insert onto the conductive lines.

It is an advantage of embodiments of the present invention that the at least one conductive line is not damaged during manufacture.

In some embodiments of the present invention, providing at least one conductive line comprises providing at least one conductive track, further wherein providing at least one dummy track comprises providing the at least one dummy track simultaneously with providing at least one conductive line being a conductive track.

It is an advantage of embodiments of the present invention that the metallic deposition can be made easily and in a batch, for both the protective dummy track and conductive lines without changing the metallization mask.

In some embodiments of the present invention, providing at least one dummy track comprises providing at least one metallic track parallel to the at least one metallic track. It is an advantage of embodiments of the present invention that the mask can be provided easily. It is a further advantage that the conductive line can be protected in a large portion thereof.

In some embodiments of the present invention, providing the at least one dummy track comprises providing at least one track higher than the at least one conductive line, to improve contact between the insert and the dummy track and to reduce or to avoid contact between the insert and the conductive line.

It is an advantage of embodiments of the present invention that contact between the conductive line and the insert can be completely avoided.

In some embodiments of the present invention, the method comprises providing an additional layer, wherein the additional layer allows rising the height of the at least one dummy track, the conductive line being provided outside the additional layer.

It is an advantage of embodiments of the present invention that the layer can be easily formed in predetermined regions separating the first region and the region to be protected by moulding compound. It is a further advantage that the same layer can accommodate several dummy tracks.

In some embodiments of the present invention, the method further comprises providing at least one further structure, e.g. strip, arranged for blocking moulding compound from infiltrating the first region.

It is an advantage of embodiments of the present that the moulding compound is prevented from infiltrating the first region through the space between the active element and the insert.

In some embodiments of the present invention, providing the at least one dummy track comprises providing an elongated track, the further structure or strip being perpendicular to the elongated track. It is an advantage of embodiments of the present invention that the further structure can act as a wall for the moulding compound while the dummy track can protect the conductive line in at least a portion of its length.

In some embodiments of the present invention, providing an active element comprises providing a first region comprising a sensing structure with a membrane. It is an advantage of embodiments of the present invention that the method is a high yield method of manufacturing integrated pressure sensors.

In some embodiments of the present invention, forming the package comprises providing a moulding compound for covering the second region, wherein the insert impedes moulding compound from reaching at least the first region, so that the active element forms a cantilever protruding from the moulding compound.

It is an advantage of embodiments of the present invention that relative pressure sensors can be provided.

In some embodiments of the present invention, providing the active element comprises attaching the active element to a platform and providing electrical connections to a processing unit before forming the package. It is an advantage of embodiments of the present invention that the use of a support platform facilitates handling during manufacture.

In some embodiments of the present invention, the method further comprises providing a protective layer over the conductive line and the dummy track. This allows providing protection against chemical or mechanical damage. The present invention allows reducing or avoiding damage of the protective layers covering the conductive lines. Even if the protective layers over the dummy track are damage, since these do not carry signals, the conductive lines are effectively protected.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
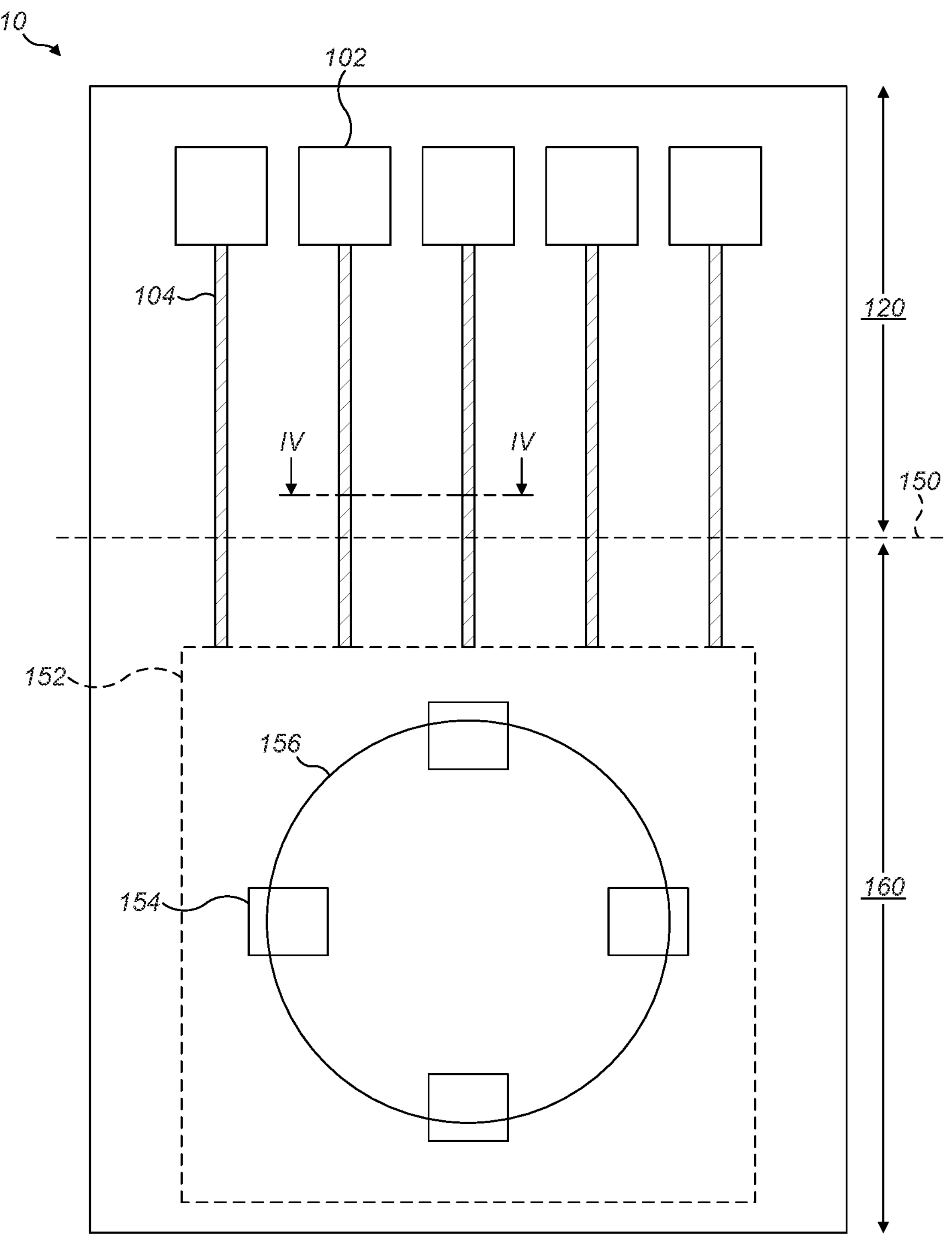
FIG. 1 illustrates a substrate including a sensing structure and a contact pad connected to the sensing structure by a conductive line.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "sensor package", reference is made to a device including sensing means and connections for an external output. At least part of the sensor package is protected by a moulding component, which (at least partially) encapsulates the electronics, forming the package.

Where in embodiments of the present invention reference is made to "active element", reference is made to an element of a sensor package which generates signals as a response to an external stimulus. It includes a substrate and a sensing structure comprising sensing elements which generate said signals when the stimulus reaches the sensing structure.

The substrate may be for example a semiconductor die, e.g. a sensor die. The active element includes conductive lines for routing signals away from the sensing structure. Said conductive lines are usually conductive tracks, for example metallic tracks, which can be deposited or otherwise formed on the substrate.

The present invention relates to sensor packages wherein part of the active element is not covered by moulding component. The exposed part of the active element includes the sensing structure. In order to overmould the active element without covering the sensing structure, an insert is used while applying the mould which contacts the active element on the region to be exposed.

More in detail, an illustration of an active element is shown in FIG. 1. The active element 10 may be for example a sensor die provided on a semiconductor substrate, for example a silicon-based substrate. The active element comprises a first region 160 which includes the sensing structure 152 of the device for receiving a stimulation to be measured. The active element 10 also comprises a second region 120 which includes sensitive components that can become damaged if exposed to environment, so the region should be covered by a moulding compound. The moulding compound may be any suitable compound for protection of the device, for example a polymer compound, for example epoxy-based mould compounds (EMC) as known in the art. Since the sensing structure needs to receive a stimulation to be measured, the sensor package must be configured to ensure the stimulation reaches the sensing structure. In general, this means that at least the sensing structure should be free of moulding compound.

The type of sensing structure determines the type of interaction with the environment and the parameters measured. For example, the first region 160 can be in fluid connection with the environment, thereby enabling for example pressure measurement for a pressure sensing structure 152 which includes a membrane 156 and the sensing elements 154, e.g. piezo-resistors located at least partially on the membrane. The sensing structure 152 is electrically connected, via a conductive line 104, to contact pads 102. In the present example, the sensing elements 154 are connected by conductive lines 104 to the pads 102. The conductive line may comprise a deposited metal layer. For example, it may comprise one or more connector tracks, e.g. metal tracks. The formed connector tracks may optionally be covered by one or more protective layers if required, including e.g. oxide layers, passivation layers, etc. The sensing elements may be connected as a Wheatstone bridge, or a half-bridge, or any other known configuration enabling the aimed measurement. For simplicity, the connector tracks 104 are not drawn connected to the sensing elements 154, but the skilled person understands that there are various ways to place the sensing elements and to make the connection to them, depending on the design or configuration of the sensing elements. In the present example, changes of pressure cause deformation on the membrane, and the piezo-resistors generate a signal as a response.

However, the present invention is not limited to pressure sensor packages. For example, it may be a temperature sensor package, an optical and/or infrared sensor package, etc. The sensor package may even comprise a combination of different types of sensing structures for sensing different parameters, which need to be free from moulding compound to receive the respective stimulation.

The contact pads 102 can be used to provide electrical connection to a further element, for example bonding wires or the like, for further processing of the signals. This is explained further below with reference to FIG. 3.

When the package is formed, the second region 120 of the active element 10 is covered by the mould compound to enclose, e.g. embed, the contact pads 102 and any connected bonding wires. The mould compound protects these delicate elements from harsh media that might surround the sensor package when it is in use. The dashed line 150 indicates the limit over which the mould compound may not extend on the first region. In order to keep the mould from traversing the dashed line and enter the first region 160, an insert is provided during overmoulding on said region.

The inventors found out that the conductive lines which are required to route signals from the sensing structure, and/or the protective layers on top, usually are damaged or break during manufacture. Damage in the lines causes that the signals are degraded or cannot transmit, while damage in the protective layers results in harsh media degrading the conductive lines over time. The inventors reached the conclusion that the contact with the insert was responsible for this effect.

Figure 2:
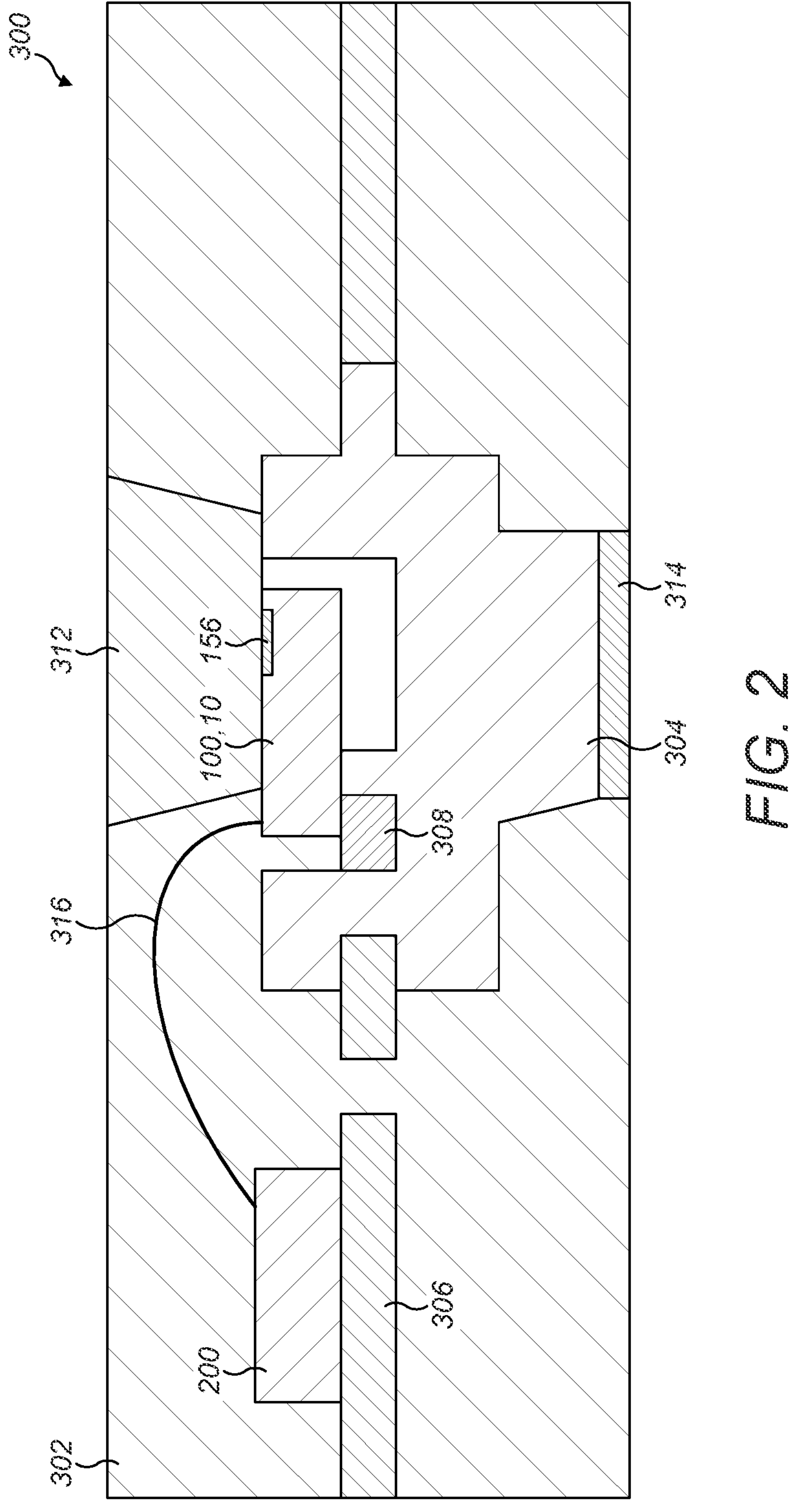
FIG. 2 illustrates a step of moulding a package wherein an insert prevents moulding compound from covering the sensing structure.

FIG. 2 shows the overmoulding step of sensor package manufacture. The package is formed in two phases or steps, a first phase wherein the active element is secured in a position, and a second phase of overmoulding, thereby forming the sensor package.

In the first phase, a support structure 304 is provided and the active element 10 is attached thereto. This allows a broad freedom of design, for example allowing providing a hanging sensing structure useful in e.g. relative pressure sensors. In particular, the active element 10 may be a MEMS die with sensing structure including a membrane 156. The die is attached to the support structure 304, which may be a pre-moulded support structure, using adhesive 308. During the first phase, electrical connections can be provided between different elements. For example, a processing unit 200 can be provided for processing signals generated in the active element 10. The processing unit may be an ASIC. The active element 10 can be electrically connected with the processing unit 200, for example using bonding wires 316 as shown in the figure between the MEMS die and the ASIC. An output for signals processed by the processing unit 200 can also be provided at this stage. For example, a leadframe 306 can be provided, which as shown in FIG. 2, may be optionally attached to the support structure 304. The ASIC 200 is electrically connected to the leadframe 306 by any suitable means. The sensor package may present alternatives to the connection of a processing unit to a leadframe, and signal output can be provided by other means suitable to the particular sensor application.

In the second phase, the moulding compound is provided to give the package its final shape. A first insert 312 is provided, which pushes from above the MEMS sensor die 10 towards the support structure 304 to make sure that the second mould 302 does not spread on the MEMS die over the line 150 (shown in FIG. 5). Optionally, a second insert 314 can be arranged to keep the structure 304 in place to ensure that the force of the first insert is directed towards the active element 10 and reduce risk of misplacement.

In some embodiments, the insert 312 may also form a closed volume underneath the active element 10, so the active element forms a hanging structure.

The overmoulding compound is then provided, covering at least part of the active element 10 and the platform 304. The insert forms a cavity in the package. The part of the active element with the sensing structure is in contact with the environment, for example the structure may be hanging, e.g. sticking out of the inner wall of the cavity, in a cantilever position.

Figure 3:
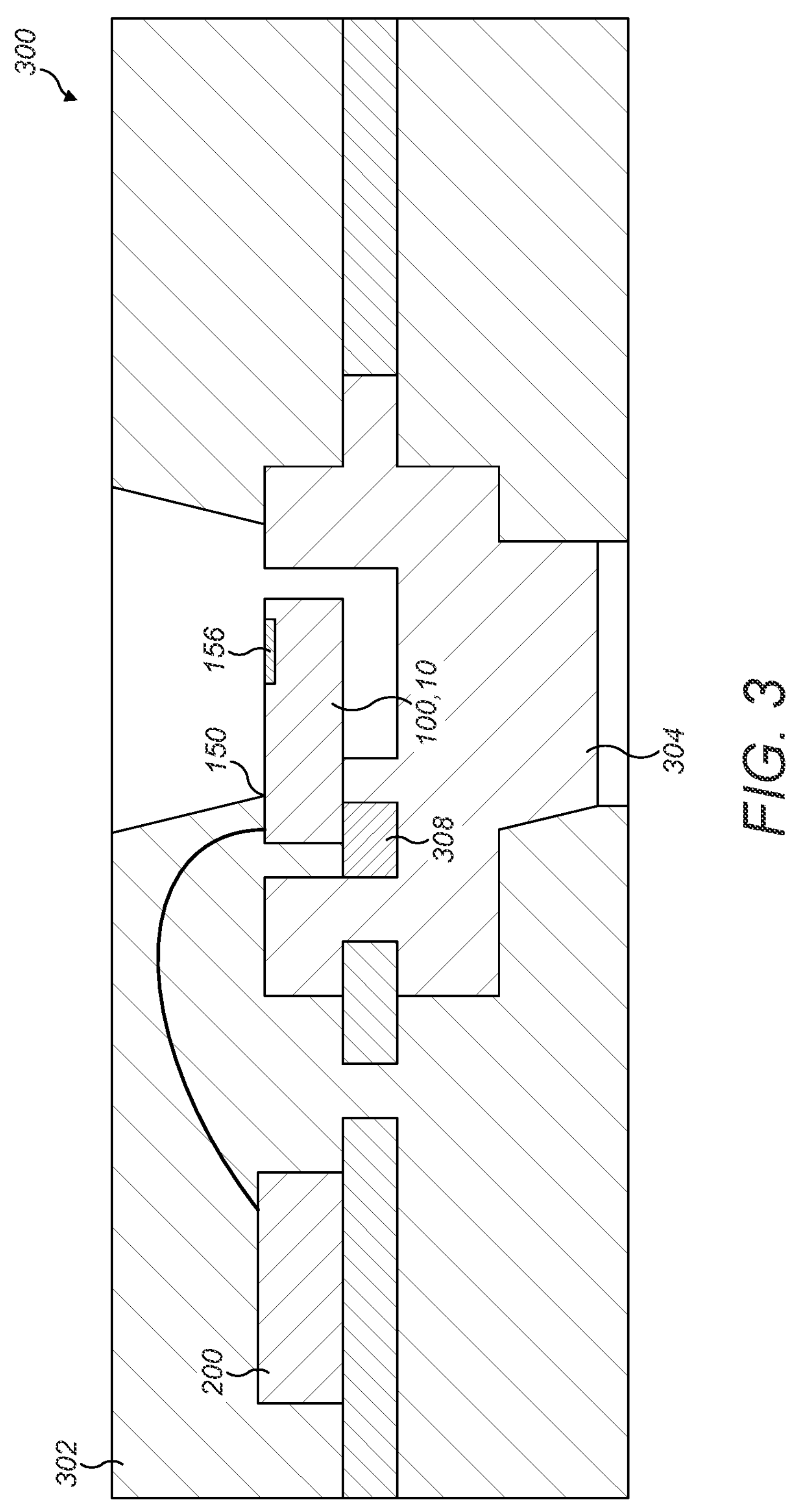
FIG. 3 illustrates a sensor package including a cavity revealing a cantilever including a sensing structure.

The first and second inserts are removed, forming the final product shown in FIG. 3.

As already pointed out, the insert may apply too much pressure on the areas containing the conductive lines. This may cause damage of the protective layers, diminishing protection which causes damage during use due to degradation of the conductive lines; in some cases, the pressure may damage or break the lines during manufacture. This introduces errors, or even makes the sensor package inviable. A possible explanation is that the areas including the conductive lines often receive the largest part of the pressure, since the lines form a relief on the active element surface.

Figure 4:
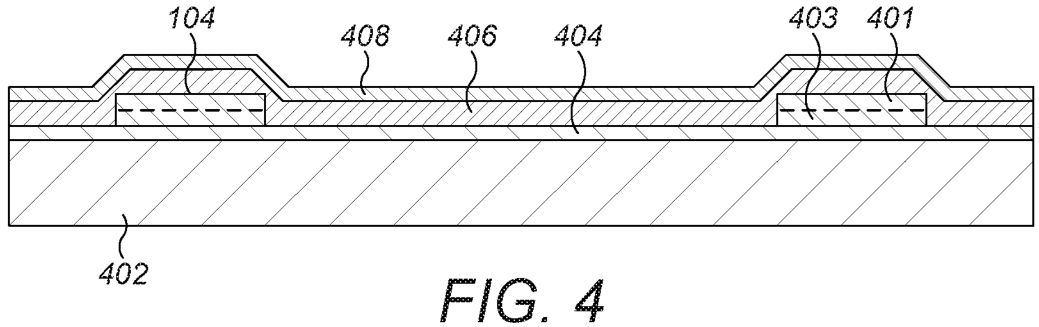
FIG. 4 illustrates the cross section indicated in FIG. 1, showing the layer stack forming conductive lines.

FIG. 4 shows a cross section indicated in FIG. 1 by the line IV-IV, wherein the at least one conductive line 104 includes connector track, e.g. a metallic track, formed as a layer stack of the active element. For example, the active layer 10 may comprise a substrate, including protection layers, e.g. passivation layers. These may be for example an LPCVD oxide layer 404 formed on the field oxide layer 402. The tracks 104 are formed on top, for example by deposition or the like (although this is not the option, they may be under some passivation layers, as explained below).

The details of the active element and conductive line may be different in different applications, for example the layers may have different composition. However, in general, the conductive line provided on the surface of the substrate of the active element causes that the height of the element is higher in places where the track (conductive line 104) is provided. In FIG. 4, the connector tracks are covered by one or more protective layers, for example an oxide layer 406 and optionally with a further LPCVD nitride layer 408 in order to be protected from the outside media. These additional layers, although they provide protection from the outside media, usually are fragile, and may crack under the pressure. If the pressure is too high, even the conductive lines may be damaged.

The present invention provides an active element including a dummy track as a solution to the damage and/or breakage problem.

A sensor package 300 in accordance with embodiments of the present invention includes material between the conductive lines for carrying signals as part of the active element 100. This material may be provided as a track (dummy track), for example by deposition, the present invention not being limited to layers provided by deposition. The presence of this material ensures that the level of the final layer on top of the track is at least the same as the level of the final layer on top of the conductive line. Since the conductive lines locally rise the surface of the active element to a predetermined height, the thickness of the active element is locally increased. In other words, there is a ‘bump’ (local increase of thickness) on the active element underneath of which the conductive line extends. The presence of the dummy track provides another ‘bump’ which is at least as protruding as the one corresponding to the conductive tracks.

The pressure of the insert, if it is at the same level, is shared between the conductive element or elements, and the dummy track or tracks. In a preferred embodiment, the level of the final layer is slightly higher on top of the material (on top of the dummy track) than the level on top of the conductive lines. In other words, the local increase of thickness is higher along the dummy track, so the ‘bump’ of the dummy track protrudes more than the ‘bump’ of the conductive tracks. This way, all the pressure is taken away from the conductive lines. This requires that the used material is hard enough so that it does not give in under the pressure. For example, the same material (e.g. metal) may be used as is used for the conductive lines. However, the difference between the levels cannot be too big in order to avoid the leakage of the moulding material towards the sensing structure. A compromise can be made between structure height and leak, taking into account factors such as viscosity or wetting of the moulding compound. Additionally, extra barriers can be added precisely to stop leakage between insert and active element.

In a first aspect, the present invention provides a sensor package including an active element with a sensing structure, wherein the active element comprises one or more dummy tracks which allow relieving pressure of the insert on the conductive lines. The purpose of the at least one dummy track is to lift the areas next to connecting line at least on level with said lines, so that the pressure from the first insert is at least evenly absorbed by the dummy tracks and the connector tracks. Thus, the at least one dummy track is provided on part of the first region containing the sensing element. However, it may extend to second region which is to be covered by moulding compound, even a relatively large portion thereof can be on the second region. This advantageously allows a high tolerance to misalignment of the insert over the first region during manufacture, in an easy way.

Figure 5:
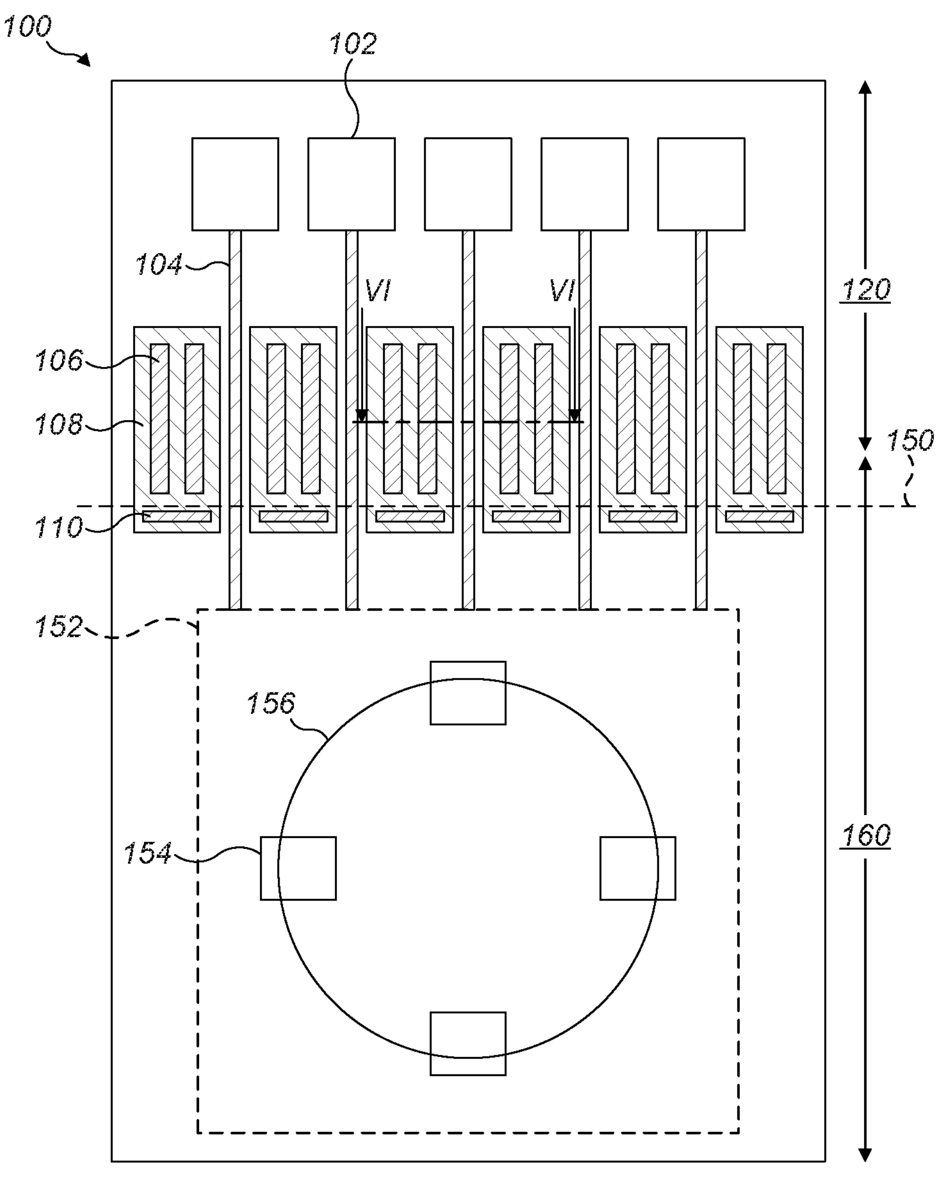
FIG. 5 illustrates an active element including a sensing structure and a contact pad connected to the sensing structure by a conductive line, further including a dummy track.

FIG. 5 shows the solution according in a top view of the active element 100 for a sensor package in accordance with embodiments of the present invention.

Many of the features of the active element 10 in FIG. 1 are common to the active element of FIG. 5, having the same reference signs. For sake of efficiency, common elements described with reference to FIG. 1 can be applied to the active element of FIG. 5 (e.g. details of types of epoxy resins, materials used, contact pads, need of a moulding compound-free region, etc.), and the details will not be repeated here.

However, the active element 100 of FIG. 5 further includes a structure or dummy track 106 with a profile equal or higher that the conductive lines 104, so as to receive pressure from the insert during overmoulding.

The one or more dummy tracks 106 may be for example provided close to the conductive line 104. For example, they may be provided surrounding a conductive line 104, e.g. interspersed on the area of the active element between conductive lines 104. The at least one dummy track can include one dummy track at each side of the conductive line, extending along the conductive line, for example parallel to the conductive line.

One or more dummy tracks 106 may be positioned at each side of the conductive line 104. For example, an additional layer 108 may extend laterally between the conductive lines 104 without reaching them, so a gap is left between the conductive line and the additional layer 108. The layer 108 may include one or more tracks 106 on top thereof. In order to ensure homogeneous distribution of the pressure from the insert during overmoulding, preferably the distance between the dummy track 106 to the neighbouring conductive line 104 is the same for each track and its corresponding neighbouring conductive line. Preferably, several tracks are used between conductive lines, rather than a wide track encompassing a large area. The reason for this is to reduce stress caused on the substrate by the dummy track, for instance to reduce thermal stresses. The thickness of the tracks may depend on the manufacturing process and tolerances, such as a range of less than 200 nm for the additional layer 108, e.g. 100 nm, and the metal track 106 of W, TiN and Ti being under 300 nm, e.g. 290 nm.

The distance between structures is also defined by the design rules of the process and tolerances, which depend on the particular technique used (e.g. vapour deposition and the like). This influences the distance between two metal structures, or the distance between the metal structures and the additional layer 108, e.g. the polysilicon layer. It is advantageous to provide a distance slightly larger than the minimum distance allowed by the process, to improve tolerance to misalignments and the like. The dummy tracks, including poly layers and such, should be close enough to (but not overlapping with) the conductive lines, to provide good protection and fault tolerance (in case a dust particle falls on the conductive lines, in case of small thickness differences of the active element, etc.).

In some embodiments, the additional layer 108 (e.g. polysilicon layer) is separated from the conductive lines 104 in the order of few microns, e.g. between 1 and 10 microns, for example 4 microns. The distance between the dummy tracks 106 and the closest conductive line may be larger than that, for example 8 microns. The width of the dummy tracks may be in the order of tens of microns, for example 30 microns. The distance to the border of the additional layer on its perpendicular sides, relative to the conductive lines, may be lower, e.g. 15 microns. The length of the dummy tracks 106 may be approximately 300 microns, while the length of the additional layer 108 may be 350 microns.

The line 150 indicates, as explained earlier, the limit over which the mould compound may not extend on the first region 160. Since, in a preferred embodiment, the dummy tracks raise the profile of the cross section higher than the conductive lines, there may be risk of ingress of mould compound beyond the line 150. To reduce the risk, an additional dummy track or strip 110 as a barrier, e.g. in the form of a strip, can be added before the line 150, in the first region 160. The dummy tracks 106 along the conductive lines may be parallel to the conductive lines, thus the strip or stripes 110 may be perpendicular to the conductive lines or a portion thereof. The conductive lines 104 may also present meandering to, in combination with the strip 110, ensure that the mould compound flows as little as possible, or does not flow at all, underneath the insert. They may also have a pressure-relieving effect as well. The barriers may be also positioned on the layer 108, advantageously raising the area in the same way as the dummy track and may contact the insert.

The strip 110 may be thinner than the dummy tracks, e.g. around 10 microns, separated from the dummy tracks by around 10 microns. The distance between the strip 110 and the border of the additional layer on its perpendicular sides, relative to the conductive lines, may be 15 microns as before.

These values are, as explained before, just exemplary and other values may be available depending on design tolerances. Preferably, the width of these structures is within the order of few tens of microns, e.g. under 100 microns.

Figure 6:
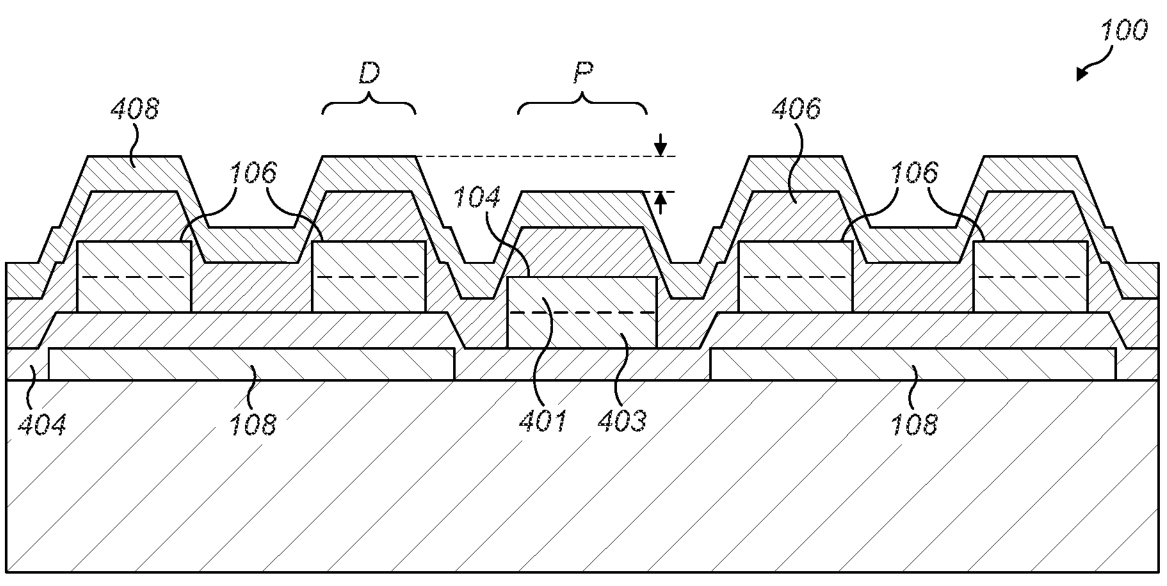
FIG. 6 illustrates the cross section indicated in FIG. 5, showing the layer stack forming conductive lines and dummy track.

The profile in FIG. 6 shows the cross section VI-VI of the active element 100 as indicated in FIG. 5. The dummy tracks 106 comprise raised structures or protrusions of at least the same height as portion P of the surface corresponding to the conductive lines 104, e.g. corresponding to the projection of the conductive line over the active element 100. This means that the profile of the active element corresponding to the area D of the external surface of the active element 100 corresponding to the dummy track is equal or higher than the profile corresponding to the position or portion P of the surface corresponding to the conductive lines.

In some embodiments, the tracks 106 provide a profile higher than the profile of the conductive lines 104. This can be ensured by different means, for example by applying taller structures. In other words, the thickness of the active element corresponding to the dummy tracks is at least equal to, preferably larger than, the thickness of the active element corresponding to the conductive element.

FIG. 5 and FIG. 6 shows a multilayer structure wherein the conductive lines are provided on the substrate of the active element 100 (e.g. on the oxide layer 404) while the dummy tracks 106 are placed on the additional layer 108, the layer 108 being provided on the substrate of the active element 100, e.g. on the oxide layer 404 of the substrate or die. The presence of the layer 108 ensures that the area of the dummy tracks will be risen higher than the conductive lines, as also shown in FIG. 6, even if the tracks themselves 106 has the same thickness as the conductive lines (e.g. if provided by the same process simultaneously). The additional layer may be for example thinner than a micron, for example in the range of 100 nm. Since a layer of polysilicon is usually provided on the active layer for many purposes (such as forming resistors, capacitors or shielding in other portions, e.g. on the sensing portion), providing the additional layer 108 as a polysilicon on the required area of the active element does not result on an additional manufacturing step. As seen before, additional layers such as protective layers and the like may be provided covering the conductive tracks. FIG. 6 shows that these layers may also cover the dummy tracks, with the same thickness for example, thereby forming a layer stack.

Thanks to the dummy tracks 106, and the strip 110, during manufacture of the sensor package 300, the insert contacts the raised areas caused by these tracks (and barriers). If the pressure applied by the insert is large enough, the protective layers of the dummy tracks may crack, or even the dummy tracks themselves, but since the dummy tracks have no functionality for signal transmission, there is no problem even if they degrade or crack. The pressure on the area of the conductive lines is relieved, and the protective layers over the conductive lines and the conductive lines themselves are not damaged.

The sensor package of the present invention is not limited to a sensor package including a sensing die connected by bond pads to a separate processing unit. It could be applied to any substrate with conductors or track on top thereof, and being covered by overmoulding compound except on a region which can be formed by applying an insert. For example, it could be applied to integrated circuits, wherein the overmould compound may be used to protect contacts and the like, and metal tracks are protected by dummy tracks.

In a second aspect, the present invention provides a method of manufacturing the sensor package of the first aspect of the present invention. Thus, the method is adapted to provide any of the features discussed with reference to the first aspect.

In particular, the method comprises providing an active element comprising at least one conductive line 104 for transmitting signals generated by a sensing structure 152 to an output, e.g. a pad 102, and providing at least a dummy track 106 for raising the profile of the active element on a first region of the active element, so the surface of the active element 100 over the dummy track 106 is at least as high as the surface of the active element over the conductive line 104. The method comprises partially overmoulding the active element while an insert covers the first region of the active element and prevents overmoulding compound from reaching the sensing structure, as shown in FIG. 2, however the active element being an active element provided in accordance with the steps of the method of the present invention. The insert contacts the surface of the active element on the area corresponding to the dummy tracks (on the protrusion caused by the dummy tracks), thus reducing or avoiding pressure applied on the surface over the conductive lines (thus reducing or avoiding pressure on the protrusion caused by the conductive lines). This protects the conductive lines, and/or any protective layer on top thereof, from damages caused by contact with the insert.

Providing the dummy track may be done simultaneously with providing the conductive lines. For example, it may be done using layer deposition technologies, for example both being metallic tracks. The dummy tracks may not be used for carrying signals, they may even be disconnected from any signal source or sink; however, the dummy tracks may be earthed, or electrically coupled to a supply voltage, or to e.g. a doped area on the substrate, to reduce or avoid charge build-up. Deposition technologies can be used to provide the layer stack forming the device, however other technologies and technology combinations can be used as required.

Figure 7:
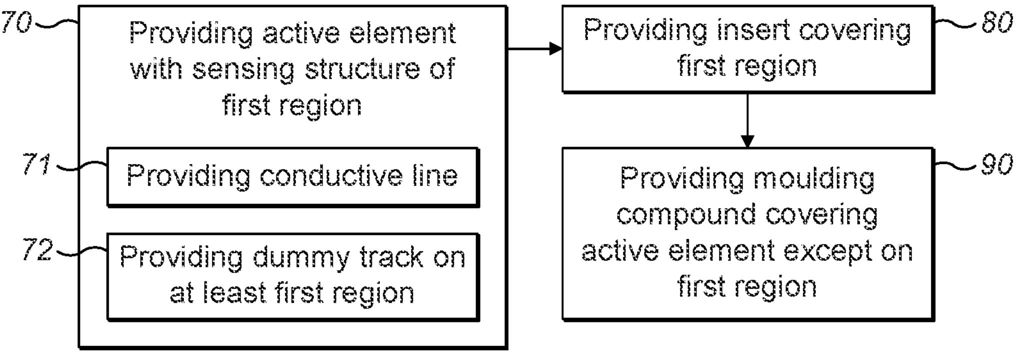
FIG. 7 is a flowchart with steps for a manufacturing method in accordance with embodiments of the present invention.

FIG. 7 is a flowchart showing manufacturing steps in accordance with embodiments of the present invention. The method comprises providing 70 an active element including a sensing structure. This includes providing 71 at least a conductive line. The active element may comprise sensing elements, membranes, a multilayer stack including passivation layers, channels, doped regions and the like. The active element may comprise more than one sensing structure. The conductive line for signal routing may be provided, for example, on an oxide layer of a sensor (e.g. semiconductor) die. Providing the active element may comprise providing a substrate including a multilayer stack, e.g. including oxide layers, e.g. an LPCVD oxide layer 404 formed on a field oxide layer 402.

Providing the conductive line may comprise providing a multi-layer track 104, for example a conductive strip 401 of W stacked over TiN, with a thin Ti layer 403 between the TiN strip and the oxide layer 404 of the substrate of the active element, to improve adhesion of the conducting line to the substrate. This stack is also shown in FIG. 4 and FIG. 6. However, other structures and/or materials can be used, such as single layers, depending on the particular applications.

The method may include adding to the active element further elements for signal transmission, such as pads 102 or the like, for transmitting signals from the sensing structure to an output, e.g. to a processing unit for processing.

The method comprises providing 72 a dummy track on, at least, the so-called first region of the substrate of the active element, being the region requiring reception of the external stimulation. The at least one dummy track may be provided adjacent to the conductive line. For example, the at least one dummy track may be provided along the conductive line, as an elongated track parallel to the conductive line. A number of tracks may be provided and distributed in the active element as explained with reference to embodiments of the first aspect. However, the present invention is not limited necessarily to elongated tracks, as long as the effect of locally raising the profile follows the requirements of the present invention, thus providing a protrusion equal in height or higher than the protrusion formed by the conductive line.

In some embodiments, providing the dummy track may comprise providing barriers for blocking moulding compound from reaching the region to be protected. The barrier may be placed on the first region. For example, when the dummy tracks are elongated tracks parallel to the conductive lines, additional tracks may be placed perpendicular thereto and facing the space between the conductive line and the parallel dummy track, thus blocking entry of the moulding compound. The barrier may also comply with the requirements of raising the profile of the active element, thus receiving the pressure of the insert. FIG. 5 shows the elongated dummy track 106 and the strip 110 both on top of the additional layer 108, so even if the barrier has the same height as the dummy track, both provide a raised profile.

In some embodiments, the dummy track (e.g. the elongated track and/or the barrier) may be provided as a metal layer, which is resistant to break under pressure.

Optionally, the dummy track(s) and the conductive line(s) may comprise the same materials, e.g. the same stack layer. Optionally, both may be provided 71, 72 at the same time, thus saving production time. This may also include providing the barrier as a dummy track which additionally serves as a moulding compound barrier.

Optionally, providing the active element 70 may comprise providing an additional layer 108 on the area where the dummy track will be or is provided. For example, it may be a polysilicon layer. It may be provided by deposition or the like, for example simultaneously with providing polysilicon layer on other areas of the active element, such as e.g. on top of the piezo-resistors. Providing such additional layer advantageously does not need to increase the number of processing steps. Subsequently, providing 71, 72 the conductive line and the dummy track comprises providing the conductive line outside layer 108 and the dummy track onto the layer 108. For example, they may be provided simultaneously as a metallization step, the conductive line being provided directly on the oxide layer 404 of the substrate, the dummy track being provided on the additional layer 108. Because the additional layer 108 lifts the area where the dummy tracks are formed from the substrate level (e.g. from the level of the field oxide layer 402), it ensures that final level of this area is higher than the area of the connector tracks 104, as can be seen from FIG. 6.

In some embodiments, providing 71, 72 the conductive line and/or the dummy track(s) comprises patterning a conductive material, e.g. metal, on the sensor die of the active element.

In some embodiments, both the line and track on their own have the same height since they have been provided in a single step, e.g. in a single metallization step. In such cases, an extra layer can advantageously be added as explained earlier, for example the added layer 108 onto the oxide layer 402 of the substrate, to raise the height of the dummy track(s).

The conductive line, and optionally the dummy tracks, may be covered by an oxide layer 406 and optionally with a further LPCVD nitride layer 408 in order to be protected from the outside environment. The resulting structure has an uneven top layer, where the places of the dummy tracks are at the same level or above of the areas corresponding to the conductive lines, so the latter areas suffer reduced pressure or no pressure by the insert during overmoulding. Thus, less cracking of the protective layers and/or of the conductive line takes place.

The method may comprise providing a platform 304 and attaching the active element 100 thereto. The method may comprise providing a processing unit 200 (e.g. an ASIC) and providing connections (e.g. by wire bonding or the like, the present invention not being limited thereto) between the processing unit and the contact pads. The method may comprise additionally providing connections to an output, e.g. a leadframe, to transmit processed signals from the processing unit to the exterior of the sensor package.

The method comprises 80 providing an insert 312 covering the first region 160. For the reasons explained above, the insert applies less pressure or does not press against the raised surface corresponding to the conductive lines (e.g. corresponding to the portion of the layer protecting said lines), as the contact area with the raised surfaces over the dummy tracks is much larger, optionally also higher. Any resulting crack or damage on the dummy track or layers on top does not affect the conducting lines.

Additional inserts can be provided for clasping the platform, for example the insert 312 for preventing moulding compound ingress, and an additional insert 314, which may e.g. hold the platform during overmoulding, as shown in FIG. 2, wherein the active element 10 of FIG. 1 is interchanged by the active element 100 including the dummy track.

The method comprises providing 90 moulding compound on the second region 120 of the active element thus covering at least the conductive line or lines, optionally also any electronic device to be included in the sensor package, e.g. the processing unit 200, and part of the leadframe. The moulding compound may be any suitable compound, e.g. EMC.

The shape of the sensor package is determined by the recipient containing the elements of the sensor package, and also by the insert. For example, the insert 312 may be arranged so as to form a cavity in the sensor package 300 revealing the sensing structure of the active element in the cavity, so as to receive stimulation.

As also shown in FIG. 2 and FIG. 3 (interchanging the active element 10 of FIG. 1 with the active element 100 including the dummy track), the platform is shaped so that the insert 312 abuts the platform 304 as well as the active element 100, forming a plug and reducing or impeding the flow of moulding compound underneath the active element 100, which remains hanging in the cantilever position, within the cavity, as shown in FIG. 3.

The method may comprise removing the insert 312 after at least partially curing the moulding compound, thereby forming a sensor package wherein the sensing structure is not covered by overmoulding compound.

In some embodiments, the cavity may be open to the environment, e.g. for a pressure sensor or the like. Optionally a window or filter or the like could be added, for other types of sensors such as optical sensors. However, the present invention is not limited to a cavity, and it could be applied to any sensor package wherein an insert is applied on a region to avoid applying overmoulding compound covering that region.

The invention claimed is:

1. A sensor package comprising:

an active element comprising a first region and a second region opposite to the first region, wherein the first region comprises a sensing structure, and the second region comprises at least one contact pad, a moulding compound encapsulating the second region, wherein the first region of the active element is free from moulding compound, the active element comprising at least one conductive line for routing signals from the sensing structure of the first region to the at least one contact pad of the second region, the active element comprising an external surface wherein the projection of the at least one conductive line over the active element corresponds to a portion of said external surface, wherein the active element further comprises at least one dummy track providing a protrusion thereby raising a portion of the surface of the active element to at least the same height as the portion corresponding to the conductive line so as to receive mechanical pressure from a moulding insert during manufacture, the dummy track extending along at least the first region laterally between the conductive lines and adjacent to the conductive lines.

2. A sensor package in accordance with claim 1 wherein the conductive line and the dummy track are covered by a protective layer thereby forming layer stacks.

3. A sensor package in accordance with claim 1, wherein the dummy track comprises at least one elongated strip extending parallel to the direction of the conductive line.

4. A sensor package in accordance with claim 1, further comprising at least one further strip arranged to prevent ingress of moulding compound into the hollows formed by the insert and the protrusion of the dummy track.

5. A sensor package in accordance with claim 4, wherein the at least one further strip is arranged perpendicular to the conductive line.

6. A sensor package in accordance with claim 1, being a pressure sensor package.

7. A sensor package in accordance with the previous claim 6, wherein the sensing structure comprises a membrane and a plurality of piezo-resistors.

8. A sensor package in accordance with claim 1, wherein the first region of the active element protrudes from the moulding compound thereby being in a cantilever position.

9. A method of providing a sensor package, the method comprising:

providing an active element comprising a first region comprising a sensing structure, and a second region being opposite to the first region, the second region comprising at least one contact pad, and at least one conductive line wherein the projection of the conductive line on the active element corresponds to a portion of an external surface of the active element, for routing signals from the sensing element to the at least one contact pad, providing an insert covering the first region, forming a package by providing a moulding compound for covering the second region including a portion of the at least one conductive line, wherein the insert impedes moulding compound from reaching at least the first region, so that the active element extends between an open volume and a packaged volume encapsulated by moulding compound, the method further comprising providing at least one dummy track laterally between the conducive lines and adjacent to the conductive lines extending along at least the first region of the active element, wherein the at least one dummy track rises the surface of the active element at least to the same height as the portion of the external surface corresponding to the conductive line, for protecting the active element from damages by reducing pressure of the insert onto the conductive lines.

10. The method of the previous claim 9 wherein providing at least one conductive line comprises providing at least one conductive track, further wherein providing at least one dummy track comprises providing the at least one dummy track simultaneously with providing at least one conductive line being a conductive track.

11. The method of claim 9 wherein providing the at least one dummy track comprises providing at least one track higher than the at least one conductive line, to improve contact between the insert and the dummy track and to reduce or to avoid contact between the insert and the conductive line.

12. The method of the previous claim 11 further comprising providing an additional layer, wherein the additional layer allows rising the height of the at least one dummy track, the conductive line being provided outside the additional layer.

13. The method of claim 9 wherein providing the at least one dummy track further comprises providing at least one further structure arranged for blocking moulding compound from infiltrating the first region.

14. The method of claim 9 wherein forming the package comprises providing a moulding compound for covering second region, wherein the insert impedes moulding compound from reaching at least the first region, so that the active element forms a cantilever protruding from the moulding compound.

15. The method of claim 9 further comprising providing a protective layer over the conductive line and the dummy track.

* * * * *